United States Patent [19]

Libres et al.

[11] Patent Number: 5,644,168
[45] Date of Patent: Jul. 1, 1997

[54] MECHANICAL INTERLOCKING OF FILLERS AND EPOXY/RESIN

[75] Inventors: Jeremias P. Libres, Dallas, Tex.; Abbas I. Attarwala, Sandyhook, Conn.; Mario A. Bolanos, Plano, Tex.; Jimmy Liang; Indran B. Nair, both of Dallas, Tex.

[73] Assignee: Texas Instruments Incorporated, Dallas, Tex.

[21] Appl. No.: 433,101

[22] Filed: May 3, 1995

[51] Int. Cl.$^6$ .................................................. H01L 23/28
[52] U.S. Cl. .......................... 257/787; 257/782; 257/783; 257/789
[58] Field of Search .................................. 257/797, 789, 257/782, 783

[56] References Cited

U.S. PATENT DOCUMENTS

| | | | |
|---|---|---|---|
| 4,882,212 | 11/1989 | Singh Deo et al. | 257/703 |
| 5,001,542 | 3/1991 | Tsukagoshi et al. | 257/783 |
| 5,113,241 | 5/1992 | Yanagida et al. | 257/783 |
| 5,483,106 | 1/1996 | Echigo et al. | 257/783 |
| 5,550,408 | 8/1996 | Kumitomo et al. | 257/783 |

Primary Examiner—Mahshid D. Saadat
Assistant Examiner—S. V. Clark
Attorney, Agent, or Firm—Warren L. Franz; Wade James Brady, III; Richard L. Donaldson

[57] ABSTRACT

A semiconductor package which comprises a lead frame, a semiconductor chip secured to the lead frame and a mold composition encasing the lead frame and the semiconductor chip has a filler of ceramic particles. Each of the ceramic particles, preferably silica or alumina, has macroscopic pores of sufficient size to receive a resin binder therein, the pores extending from the surface of the particle to the particle interior. A permanently hardenable composition adherable to the ceramic particles preferably an epoxy cresol novolac, extends around the ceramic particles and into the pores. The ceramic particles are formed by providing ceramic particles having a macroscopically smooth surface and subjecting the surfaces of the particles to a composition capable of removing portions of the particles, preferably hydrofluoric acid, while agitating the particles to form the pores.

16 Claims, 1 Drawing Sheet

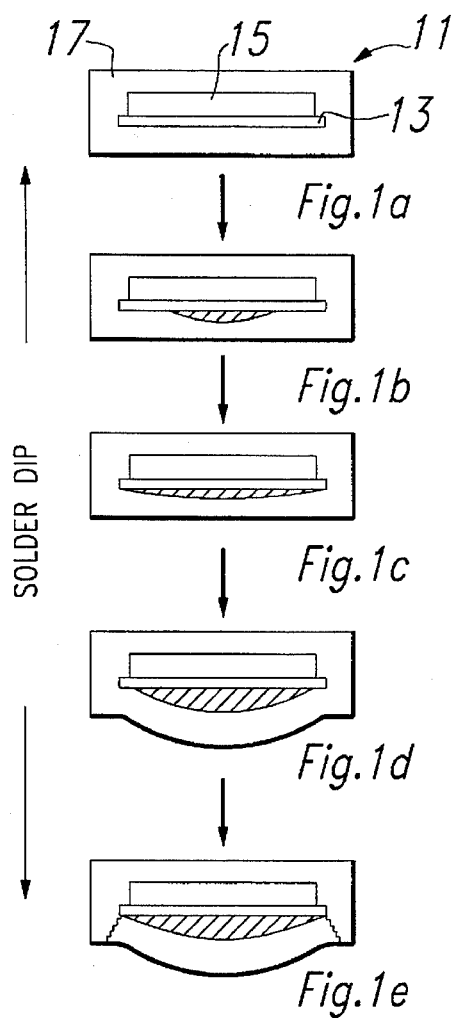
Fig.1a
Fig.1b
Fig.1c
Fig.1d
Fig.1e
SOLDER DIP
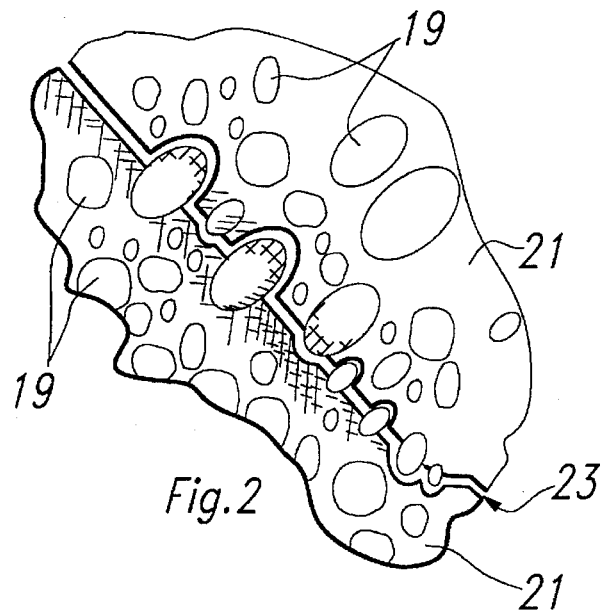
Fig.2
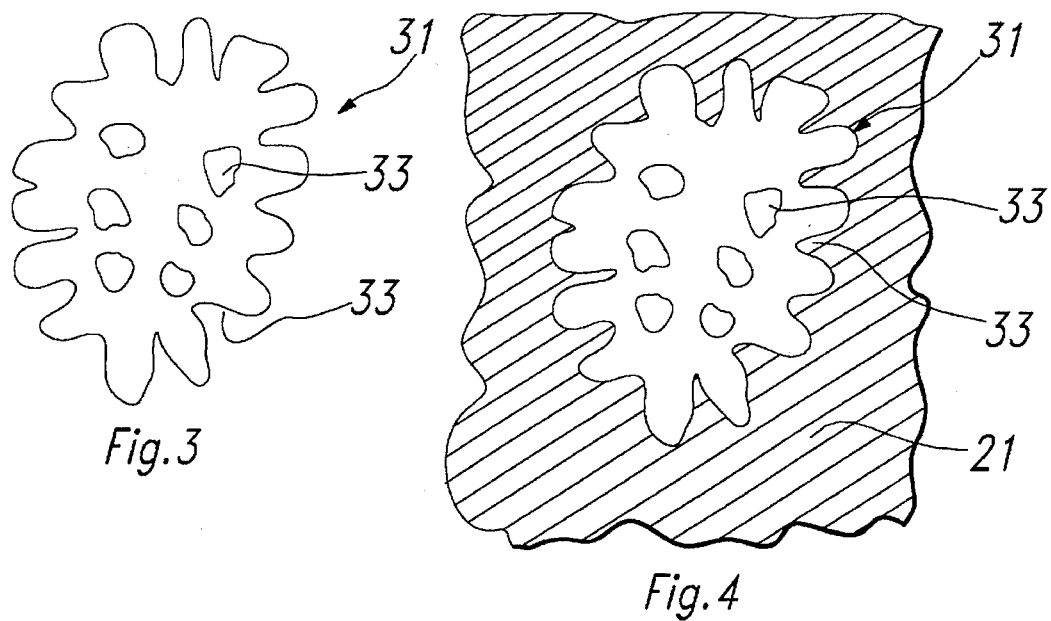
Fig.3
Fig.4

MECHANICAL INTERLOCKING OF FILLERS AND EPOXY/RESIN

BACKGROUND OF THE INVENTION

1. Field of the Invention

This invention relates to plastic encapsulation of semiconductor devices,

2. Brief Description of the Prior Art

Semiconductor plastic packaging mold compound compositions generally include a mixture of ceramic particles, generally but not limited to silica or alumina, an epoxy/resin system, generally but not limited to epoxy cresol novolacs, a hardener which is generally very water absorbent, generally but not limited to phenolic resins or acid anhydrides and a catalyst, generally boron trifluoride ($BF_3$), to determine the cure time and flow of the resin. Optional additives are rubber particles such as carboxyl terminated nitrile rubber (CTBN) or amine terminated nitrile rubber (ATBN) to increase fracture resistance or the material, increase the material viscosity and absorb moisture, flame retardants, mold release agents, coupling agents and pigment. The mold compound composition is generally from about 70 to about 90 weight percent of the ceramic particles, from about 10 to about 15 weight percent of the epoxy/resin system, from about 6 to about 8 weight percent of the hardener and from about 0.25 to about 0.50 weight percent of the catalyst. The ceramic particles have a generally smooth outer surface and are generally of somewhat spherical shape. Such compositions are generally molded over semiconductor chips and lead frames to which the chips have been bonded in standard manner to provide the completed package. The packages are later mounted to the surfaces of printed circuit boards and the like by standard soldering techniques and the like during which the packages are subjected to high temperatures.

A major problem with surface mount integrated circuits (ICs) has been moisture induced package cracking. The cracking is thought to occur when the moisture and volatiles present in the mold compound are vaporized during the solder reflow process. The vapor induces high internal stresses which are responsible for the cracking of the package. The crack develops and propagates when the strength of the mold compound material becomes less than the vapor-induced stresses. This crack may or may not be visible from the exterior of the package, but is large enough to cause substantial degradation to the reliability of the product. A cracked package will cause a device performance failure.

With the industry trend in the direction of thinner packages, numerous studies and experiments have been conducted to make the packages more robust to vapor phase reflow or infrared reflow soldering conditions. The common approach is to have simultaneous improvement on the different factors that affect package integrity. One area of focus for package improvements has been the use of highly filled mold compounds to minimize moisture absorption. A second area of focus has been to provide improved adhesion between the chip and mold compound and between the bottom die pad and mold compound, adhesion promoters and the requirement of reduced amounts of release agent making this improvement possible. A third area of improvement is being made through improvements in mold compound toughness to resist the formation and propagation of cracks. New methods have been introduced to measure the mechanical strength of the new mold compound materials in order to account for the different stresses acting internally in the package. The introduction of stress absorbers in the compound chemistry has proven to help improve its ability to resist cracking but still not guarantee to eliminate the problem. However, the problem of package cracking still exists and major efforts are ongoing to minimize this problem.

SUMMARY OF THE INVENTION

In accordance with the present invention, there is provided a mold compound composition and method of making same for fabrication of packages for semiconductor devices which minimizes the above described package crack failure problem.

Briefly, in accordance with the present invention, a ceramic filler material of spherical or random shape is altered from its prior art relatively smooth surface geometry to a surface geometry having larger pores therein than are normally found in untreated filler material. In this manner, a flowable and hardenable material, preferably an epoxy resin as used in the prior art, covers not only the surface of the filler material, but also enters into the pores extending from the surface of the filler material into the filler material interior. Accordingly, upon curing of the epoxy, the mechanical interlocking between fillers and epoxy improves the strength of the system. This provides a much stronger filler-resin interface than is present in the prior art when using smooth surface filler material. The result is that the filler-resin interface can resist much higher pressures due to vapor pressure within the packaging compound and thereby diminish the problem of package cracking due to exposure to extremes of heat and/or pressure.

The mold compound composition used is the same as used in the prior art except that the filler material particles are altered to have pores therein which extend to the particle surface. The formation of such filler material particles can be provided in many ways. A preferred system is to place the prior art filler particles into a bath of a material which will attack the filler material particles and primarily the microscopic holes and/or imperfections in the surface thereof. The particles are preferably also ultrasonically agitated, either with or without heating, for a sufficient period to provide the desired pores in the surface of the particles. The length of time required in the bath will be a function of the bath material used, the concentration of the bath material, the intensity of ultrasonic agitation, the amount and depth of pore formation required and the temperature of the bath. A preferred bath material for a silica filler is a 49% solution of hydrofluoric acid. The ultrasonic agitation frequency can vary from zero up, the speed of pore formation being a direct function of the agitation frequency.

BRIEF DESCRIPTION OF THE DRAWINGS

FIGS. 1a to 1e show the standard progression from a standard undamaged semiconductor package to the final damaged progression;

FIG. 2 is a cross-sectional view of a moisture induced crack being formed in a prior art semiconductor packaging composition;

FIG. 3 is a side view of a ceramic particle which replaces the ceramic particles of prior art mold compound compositions in accordance with the present invention; and FIG. 4 shows the particle of FIG. 3 surrounded by the epoxy with the epoxy extending into the pores of the ceramic particle.

DESCRIPTION OF THE PREFERRED EMBODIMENT

Referring first to FIGS. 1a to 1e, there is shown the progression from a standard undamaged semiconductor package to the final damaged package caused by subjecting the package to heat and causing moisture contained in the package to expand and cause cracking. FIG. 1a shows the uncracked package 11 including a lead frame 13, a semiconductor chip 15 secured to the lead frame and the packaging material 17 surrounding the lead frame and the chip. With heating of the package, moisture within the package is vaporized and expands to produce localized stresses at the mold compound and lead frame interface as shown in FIG. 1b. Delamination commences and more moisture accumulates in the delaminated interface by capillary action to further increase delamination as shown in FIG. 1c. The package then swells and deforms as shown in FIG. 1d and the package then displays cracks as shown in FIG. 1e when the fractural strength of the plastic or packaging composition is lower than the intensity created by the deformation.

Referring to FIG. 2, there is shown a magnified view of a typical moisture induced crack developing in a semiconductor package of the prior art. The mold composition includes somewhat spherical smooth surfaced filler particles 19 surrounded by resin 21 with the amount of resin typically being greater in volume than the volume of the interstices between the filler particles so that the filler particles are generally surrounded by resin. When moisture is absorbed by the mold compound composition and vaporizes due to the application of heat to the package, the resin and filler particles separate as shown at the filler-resin interface. This separation propagates along the package as shown at 23, until it ultimately reaches the package surface, thereby exposing the lead frame and chip at the package interior to corrosion and other types of damage which diminish the electrical properties of the device and can cause failure thereof.

Referring now to FIG. 3, there is shown a typical filler particle of silica 31 which has been altered so that it has pores 33 along the entire surface region thereof which extend from the particle surface partially into the particle interior. Filler particles such as the particle 31 replace the smooth surfaced and essentially pore-free particles 19 as used in the prior art. A typical mold compound composition would use, for example, 75 weight percent silica particles 31 with pores 33 as shown in FIG. 3. Homogeneously mixed therewith would be 14 weight percent epoxy cresol novolac, 7 weight percent phenolic resins, preferably orthocresonovolac, or acid anhydride hardener, 0.4 weight percent of a boron trifluoride catalyst and the remainder one or more of rubber particles, flame retardant, mold release agent, coupling agent and pigment.

The pore-containing silica particles 31 are formed by providing standard somewhat spherical or randomly shaped relatively smooth surfaced silica particles and placing the particles in a bath of concentrated hydrofluoric acid for four minutes at room temperature while ultrasonically agitating the bath at 20 KHz for four minutes. The result is somewhat spherically shaped or randomly shaped particles 31 having pores 33 extending from the surface thereof into the particle interior.

The mold compound composition as set forth above, but using the altered silica particles 31 as above described, is then formulated and deposited over a chip and lead frame combination in standard manner. The result, as shown in FIG. 4, is that the resin 21 enters the pores 33 of the filler particles 31 during mold compound composition formulation and is retained in the pores upon hardening of the resin due to cross-linking. The permeation of the epoxy into the fillers creates a mechanical interlocking between the two which enhances the mechanical strength of the system. The result is that a much greater surface area of the particles is bonded to the resin and the bonding within the pores provides greater strength due to the irregular shapes of the pores, thereby providing increased bond strength and reduced crack failure.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A mold composition for use in semiconductor packaging comprising:
   (a) a filler of ceramic particles, each of said ceramic particles having macroscopic pores of sufficient size to receive a resin binder therein, said pores extending from the surface of said particle to the particle interior; and
   (b) a flowable and permanently hardenable resin binder composition adherable to said ceramic particles extending around said ceramic particles and extending into said pores.

2. The mold composition of claim 1 wherein said ceramic particles are taken from the class consisting of silica and alumina.

3. The mold composition of claim 1 wherein said permanently hardenable composition is an epoxy cresol novolac.

4. The mold composition of claim 2 wherein said permanently hardenable composition is an epoxy cresol novolac.

5. A semiconductor package which comprises:
   (a) a semiconductor chip; and
   (b) a mold composition encasing said semiconductor chip comprising:
      (i) a filler of ceramic particles, each of said ceramic particles having macroscopic pores of sufficient size to receive a resin binder therein, said pores extending from the surface of said particle to the particle interior; and
      (ii) a permanently hardenable resin binder composition adherable to said ceramic particles extending around said ceramic particles and extending into said pores.

6. The package of claim 5 wherein said ceramic particles are taken from the class consisting of silica and alumina.

7. The package of claim 5 wherein said permanently hardenable composition is an epoxy cresol novolac.

8. The package of claim 6 wherein said permanently hardenable composition is an epoxy cresol novolac.

9. The package of claim 5 further including a lead frame secured to said semiconductor chip, said mold composition encasing said lead frame.

10. The package of claim 6 further including a lead frame secured to said semiconductor chip, said mold composition encasing at least a portion of said lead frame.

11. The package of claim 7 further including a lead frame secured to said semiconductor chip, said mold composition encasing at least a portion of said lead frame.

12. The package of claim 8 further including a lead frame secured to said semiconductor chip, said mold composition encasing at least a portion of said lead frame.

13. A semiconductor package, comprising:

a semiconductor chip; and a hardened mold composition surrounding said chip; said mold composition including filler particles surrounded by resin; each filler particle having an outside surface, an interior and pores extending from along the entire particle surface into the particle exterior; and said resin permeating into and hardened within said pores creating a mechanical interlocking between said filler and said resin.

14. The package of claim 13, wherein said filler particles comprise 75 percent by weight of said mold composition.

15. The package of claim 13, wherein said filler particles comprise ceramic particles pretreated in an ultrasonically agitated acid bath.

16. The package of claim 13, wherein said resin comprises an epoxy resin and said filler particles comprise ceramic particles.

* * * * *